(12) United States Patent
Cai (10) Patent No.: US 10,424,647 B2
(45) Date of Patent: Sep. 24, 2019

(54) TRANSISTORS HAVING GATES WITH A LIFT-UP REGION

(71) Applicant: TEXAS INSTRUMENTS INCORPORATED, Dallas, TX (US)

(72) Inventor: Jun Cai, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/788,216

(22) Filed: Oct. 19, 2017

(65) Prior Publication Data

US 2019/0123155 A1  Apr. 25, 2019

(51) Int. Cl.

| H01L 29/00 | (2006.01) |
|---|---|
| H01L 29/40 | (2006.01) |
| H01L 29/78 | (2006.01) |
| H01L 29/10 | (2006.01) |
| H01L 21/265 | (2006.01) |

(Continued)

(52) U.S. Cl.
CPC ...... *H01L 29/408* (2013.01); *H01L 21/02238* (2013.01); *H01L 21/2652* (2013.01); *H01L 21/26586* (2013.01); *H01L 29/063* (2013.01); *H01L 29/1045* (2013.01); *H01L 29/1095* (2013.01); *H01L 29/42368* (2013.01); *H01L 29/66659* (2013.01); *H01L 29/66681* (2013.01); *H01L 29/7816* (2013.01); *H01L 29/7835* (2013.01)

(58) Field of Classification Search
CPC ............. H01L 29/7835; H01L 29/7816; H01L 29/66659; H01L 29/66681; H01L 29/1095; H01L 29/42368; H01L 29/1045
See application file for complete search history.

(56) References Cited

U.S. PATENT DOCUMENTS

| 6,620,692 B2 * | 9/2003 | Scott .................. H01L 29/7816 438/270 |
|---|---|---|
| 9,214,548 B1 | 12/2015 | Kim et al. |

(Continued)

FOREIGN PATENT DOCUMENTS

| RU | 2016112149 A | 10/2017 |
|---|---|---|
| RU | 2639579 C2 | 12/2017 |

OTHER PUBLICATIONS

PCT Search Report for Application No. PCT/US 2018/056533, dated Jan. 31, 2019.

*Primary Examiner* — Ngan V Ngo
(74) *Attorney, Agent, or Firm* — Andrew R. Ralston; Charles A. Brill; Frank D. Cimino (57) ABSTRACT

In accordance with at least one embodiment of the invention, a transistor comprises a semiconductor, a first drift layer, a drain region, a body region, a source region, a shallow trench isolation region, a dielectric, and a gate. The first drift layer is formed in the semiconductor and has majority carriers of a first type. The drain region is formed in the first drift layer and has majority carriers of the first type. The body region is formed in the semiconductor and has majority carriers of a second type. The source region is formed in the body region and has majority carriers of the first type. The shallow trench isolation region is formed in the first drift layer and disposed between the drain region and the body region. The dielectric is formed on the semiconductor, and the gate is formed over the dielectric and has a lift-up region.

18 Claims, 5 Drawing Sheets

(51) Int. Cl.
*H01L 29/66* (2006.01)
*H01L 21/02* (2006.01)
*H01L 29/06* (2006.01)
*H01L 29/423* (2006.01)

(56) References Cited

U.S. PATENT DOCUMENTS

| | | | | |
|---|---|---|---|---|
| 2005/0189585 A1* | 9/2005 | Jones | ............... | H01L 29/0886 257/330 |
| 2008/0067615 A1* | 3/2008 | Kim | ............... | H01L 29/0653 257/408 |
| 2013/0175615 A1* | 7/2013 | Uhlig | ............ | H01L 21/823814 257/339 |
| 2013/0181287 A1* | 7/2013 | Zhang | ............ | H01L 21/26506 257/335 |
| 2014/0035033 A1* | 2/2014 | Lim | ............... | H01L 29/7817 257/338 |
| 2015/0249126 A1* | 9/2015 | Kataoka | .......... | H01L 29/66659 257/343 |
| 2015/0325693 A1* | 11/2015 | Mori | ............... | H01L 29/0847 257/339 |
| 2016/0087039 A1* | 3/2016 | Ko | ............... | H01L 29/7816 257/339 |
| 2016/0099340 A1* | 4/2016 | Hsu | ............... | H01L 29/66689 257/339 |
| 2016/0190269 A1* | 6/2016 | Brown | ............ | H01L 29/66659 438/286 |
| 2016/0372591 A1 | 12/2016 | Huang et al. | | |
| 2017/0125252 A1* | 5/2017 | Strachan | ............ | H01L 29/7831 |
| 2017/0179260 A1* | 6/2017 | Edwards | ............ | H01L 27/0928 |
| 2017/0213895 A1* | 7/2017 | Edwards | ............ | H01L 29/7823 |
| 2017/0222042 A1* | 8/2017 | Lee | ............... | H01L 29/7824 |
| 2017/0263763 A1* | 9/2017 | Ryu | ............... | H01L 29/7816 |
| 2017/0271482 A1* | 9/2017 | Jung | ............... | H01L 21/0274 |
| 2017/0317208 A1* | 11/2017 | Chin | ............... | H01L 29/7816 |
| 2018/0069116 A1* | 3/2018 | Ningaraju | ........... | H01L 29/7835 |
| 2018/0102431 A1* | 4/2018 | Mori | ............... | H01L 29/7823 |
| 2018/0175192 A1* | 6/2018 | Fujii | ............... | H01L 21/76224 |
| 2018/0182890 A1* | 6/2018 | Mori | ............... | H01L 29/402 |

* cited by examiner

TRANSISTORS HAVING GATES WITH A LIFT-UP REGION

BACKGROUND

LDMOSs (Laterally Diffused MOSFET) are transistors that find wide use in many high-voltage switching applications, for example in switching DC-to-DC converters. To reduce the size of inductors used in some DC-to-DC converters, an LDMOS is switched on and off at a relatively high frequency.

SUMMARY

In accordance with at least one embodiment of the invention, a transistor comprises a semiconductor, a first drift layer, a drain region, a body region, a source region, a shallow trench isolation region, a dielectric, and a gate. The first drift layer is formed in the semiconductor and has majority carriers of a first type. The drain region is formed in the first drift layer and has majority carriers of the first type. The body region is formed in the semiconductor and has majority carriers of a second type. The source region is formed in the body region and has majority carriers of the first type. The shallow trench isolation region is formed in the first drift layer and disposed between the drain region and the body region. The dielectric is formed on the semiconductor, and the gate is formed over the dielectric and has a lift-up region.

In accordance with at least one embodiment of the invention, the transistor further comprises a doped region formed in the first drift layer, where the doped region has majority carriers of the first type.

In accordance with at least one embodiment of the invention, the dielectric has a lift-up region under the lift-up region of the gate.

In accordance with at least one embodiment of the invention, the doped region shares a rounded interface with the shallow trench isolation region.

In accordance with at least one embodiment of the invention, the rounded interface reduces a local electric field during operation of the transistor.

In accordance with at least one embodiment of the invention, the transistor further comprises a second drift layer formed in the semiconductor, where the second drift layer has majority carriers of the first type.

In accordance with at least one embodiment of the invention, a method comprises forming in a semiconductor a first drift layer having majority carriers of a first type, forming a shallow trench isolation region in the first drift layer, growing a pad oxide layer over the semiconductor, depositing a nitride layer over the pad oxide layer, depositing a photoresist layer over the nitride layer, exposing an opening pattern in the photoresist layer, etching an opening in the photoresist layer based on the opening pattern to expose an opening to the nitride layer, etching the opening to the nitride layer to expose an opening to the pad oxide layer, removing the photoresist layer, growing oxide on the opening to the pad oxide layer, removing the nitride layer, removing the pad oxide layer, and leaving at least part of the oxide grown on the pad oxide layer, growing a gate oxide layer, forming a gate over the gate oxide layer, forming in the first drift layer a drain region having majority carriers of the first type, forming in the semiconductor a body region having majority carriers of a second type, and forming in the body region a source region having majority carriers of the first type.

2

In accordance with at least one embodiment of the invention, where when growing the oxide on the opening to the pad oxide layer, the oxide is grown to a thickness of at least 200 angstroms.

In accordance with at least one embodiment of the invention, the method further comprises implanting dopants through the opening to the pad oxide layer to provide majority carriers of the first type.

In accordance with at least one embodiment of the invention, for the method, the majority carriers of the first type are electrons and the majority carriers of the second type are holes, wherein implanting dopants through the opening to the pad oxide layer includes implanting phosphorous or arsenic at a dose of $6 \cdot 10^{11}$ cm$^{-2}$ to $9 \cdot 10^{12}$ cm$^{-2}$ with energy in the range of 25 KeV to 250 KeV, with implant angles from 0° to 9°.

In accordance with at least one embodiment of the invention, for the method, the semiconductor comprises silicon. The oxide, pad oxide layer, and gate oxide layer each comprises silicon dioxide. Furthermore, growing the oxide on the opening to the oxide pad layer includes oxidizing the semiconductor.

In accordance with at least one embodiment of the invention, the method further comprises forming in the semiconductor a second drift layer having majority carriers of the first type.

In accordance with at least one embodiment of the invention, forming in the semiconductor the first drift layer comprises implanting arsenic in the semiconductor with a dose of $8 \cdot 10^{11}$ cm$^{-2}$ to $2 \cdot 10^{13}$ cm$^{-2}$ at an energy of 25 KeV to 400 KeV, with implant angles from 0° to 9°. Furthermore, forming in the semiconductor the second drift layer comprises implanting phosphorus in the semiconductor with a dose of $1 \cdot 10^{12}$ cm$^{-2}$ to $2 \cdot 10^{13}$ cm$^{-2}$ at an energy of 160 KeV to 1 MeV, with implant angles from 0° to 9°.

In accordance with at least one embodiment of the invention, forming in the semiconductor the first buried layer comprises implanting boron into the semiconductor with a dose of $1 \cdot 10^{12}$ cm$^{-2}$ to $2 \cdot 10^{13}$ cm$^{-2}$ at an energy of 800 KeV to 2 MeV, with implant angles from 0° to 9°.

In accordance with at least one embodiment of the invention, the method further comprises forming in the semiconductor a second buried layer having majority carriers of the second type.

In accordance with at least one embodiment of the invention, a second transistor comprises a semiconductor, a first drift layer, a drain region, a body region, a source region, a shallow trench isolation region, a dielectric, and a doped region. The first drift is formed layer in the semiconductor and has majority carriers of a first type. The drain region is formed in the first drift layer and has majority carriers of the first type. The body region is formed in the semiconductor and has majority carriers of a second type. The source region is formed in the body region and has majority carriers of the first type. The shallow trench isolation region is formed in the first drift layer and is disposed between the drain region and the body region. The dielectric is formed on the semiconductor, and the doped region is formed in the first drift layer and has majority carriers of the first type.

In accordance with at least one embodiment of the invention, for the second transistor above, the doped region shares a rounded interface with the shallow trench isolation region.

In accordance with at least one embodiment of the invention, for the second transistor above, the rounded interface reduces a local electric field during operation of the transistor.

BRIEF DESCRIPTION OF THE DRAWINGS

For a detailed description of various examples, reference will now be made to the accompanying drawings in which.

DETAILED DESCRIPTION

LDMOSs are switched on and off at a relatively high frequency to reduce the size of inductors used in some DC-to-DC converters. However, high frequency switching may lead to energy losses due to the gate-to-source capacitance and gate-to-drain capacitance of an LDMOS. Furthermore, an LDMOS may exhibit hot carrier degradation, thereby adversely affecting the LDMOS characteristics and manufacturability. It is desirable to provide LDMOSs suitable for high frequency switching, with an acceptable figure-of-merit $R_{SP}Q$ product, where $R_{SP}$ is the specific drain-to-source on-resistance and Q is the gate charge.

In accordance with the disclosed embodiments, a transistor, such as an LDMOS, comprises a gate having a lift-up region. The lift-up region is proposed to help reduce the capacitance between the gate and the drift layer of the LDMOS. An LDMOS may comprise a shallow trench isolation (STI) region having a rounded corner in the junction field effect transistor (JFET) region of the LDMOS. The rounded corner is proposed to help improve the interface between the STI region and the JFET region, and to help provide reduced surface field (RESURF), as well as mitigation of hot carrier degradation. In some embodiments, doping of the JFET region may be fine-tuned by self-aligned implanting in the JFET region. In accordance with the disclosed embodiments, an LDMOS comprises a deep p-type buried layer adjacent to a p-type buried layer, and for some embodiments comprises two n-type drift layers, where the p-type and n-type layers have graded doping profiles for RESURF and for providing fully depleted regions under high voltage operation.

Figure 1:
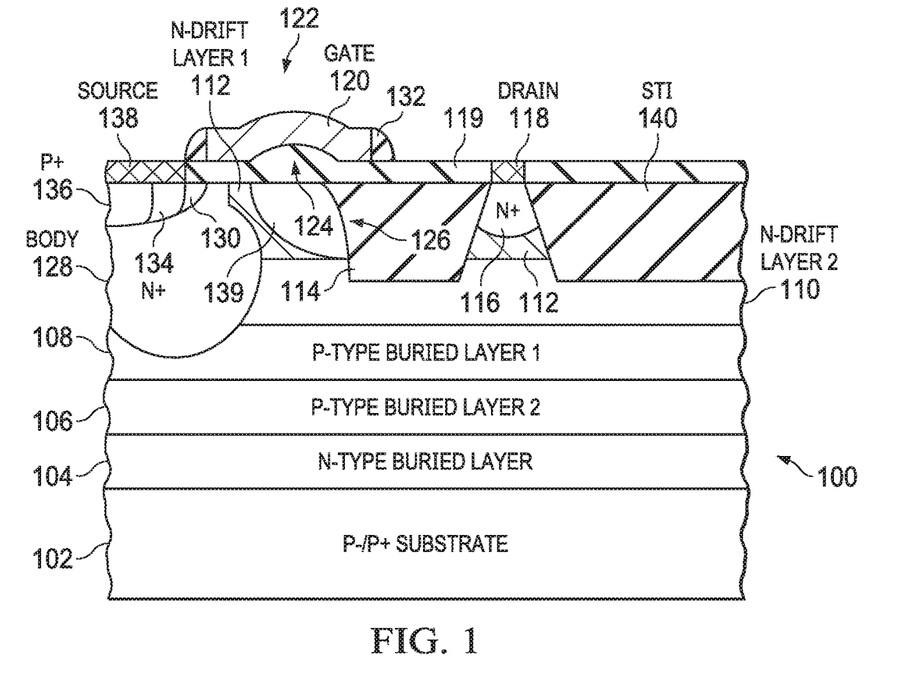
FIG. 1 shows an illustrative LDMOS in accordance with various examples.

FIG. 1 shows an illustrative LDMOS 100 according to an embodiment. The illustrative LDMOS 100 is formed in a p-type silicon substrate 102 that may initially be lightly doped p− to highly doped p+. For ease of illustration, FIG. 1 does not show all typical elements of an LDMOS, such as various metal and dielectric layers formed above the active region in the silicon substrate 102 as part of the BEOL (Back End Of Line) fabrication of an integrated circuit device. FIG. 1 illustrates a simplified cross-section of the illustrative LDMOS 100, where the illustrated features are not drawn to scale.

Formed in the silicon substrate 102 are an n-type buried layer 104, a p-type buried layer 106, and a p-type buried layer 108. In some embodiments, the p-type buried layer 106 is formed by implanting boron into the silicon substrate 102 with a dose of $3 \cdot 10^{12}$ cm$^{-2}$ to $8 \cdot 10^{12}$ cm$^{-2}$ at an energy of 800 KeV to 2.5 MeV. In some embodiments, the p-type buried layer 108 is formed by implanting boron into the silicon substrate 102 with a dose of $1 \cdot 10^{12}$ cm$^{-2}$ to $2 \cdot 10^{13}$ cm$^{-2}$ at an energy of 800 KeV to 2 MeV, with implant angles from 0° to 9°.

The relationship among the layers in the illustrative LDMOS 100 may be described as the p-type buried layer 108 being formed on the p-type buried layer 106, and the p-type buried layer 106 being formed on the n-type buried layer 104, where the p-type buried layer 108 and the p-type buried layer 106 are adjacent to each other, and the p-type buried layer 106 and the n-type buried layer 104 are adjacent to each other. However, it is to be appreciated that these layers may not have precisely defined boundaries where one layer stops and an adjacent layer begins.

Formed in the silicon substrate 102 are an n-type drift layer 110 and an n-type drift layer 112. In some embodiments, the n-type drift layer 110 is formed by implanting phosphorus with a dose of $1 \cdot 10^{12}$ cm$^{-2}$ to $2 \cdot 10^{13}$ cm$^{-2}$ at an energy of 160 KeV to 1 MeV, with implant angles from 0° to 9°. In some embodiments, the n-type drift layer 112 is formed by implanting arsenic with a dose of $8 \cdot 10^{11}$ cm$^{-2}$ to $2 \cdot 10^{13}$ cm$^{-2}$ at an energy of 25 KeV to 400 KeV, with implant angles from 0° to 9°. The n-type drift layer 110 and the n-type drift layer 112 may be described as being adjacent to each other, where the n-type drift layer 112 is formed on the n-type drift layer 110. The n-type drift layer 110 may be described as being adjacent to and formed on the p-type buried layer 108. However, these layers may not have precisely defined boundaries where one layer stops and an adjacent layer begins.

In some embodiments, the order in forming the layers 104, 106, 108, 110, and 112 is implied by their ordered illustration in FIG. 1, where the n-type buried layer 104 is formed in the silicon substrate 102 before the p-type buried layer 106, and the layer p-type buried layer 108 is formed after forming the p-type buried layer 106, followed by forming the n-type drift layer 110 and then the n-type drift layer 112. For some embodiments, the same mask may be utilized when forming the layers 104, 106, 108, 110, and 112.

An STI region 114 is formed in the n-type drift layer 110 and in the n-type drift layer 112. A drain region 116 is formed in the n-type drift layer 112 adjacent to the STI region 114. For the embodiment of FIG. 1, the drain region 116 is highly doped n-type. A contact 118 is made to the drain region 116 to provide electrical connection from the drain region 116 to other vias and metal layers, not shown. The STI region 114 is a dielectric and may comprise $SiO_2$ (silicon dioxide).

A gate 120 is formed over a gate oxide region 119, above part of STI region 114, and includes a lift-up region 122. The gate 120 may comprise polysilicon. The lift-up region 122 arises because the STI region 114 has a lift-up region 124, and the lift-up region 124 is due to edge oxide growth of the STI region 114. This growth also causes a rounded corner 126, as will be described in more detail later. The lift-up regions 122 and 124 are proposed to help reduce the gate-to-drain capacitance of the illustrative LDMOS 100, and the rounded corner 126 is proposed to provide RESURF.

The lift-up regions 122 and 124 may be described as being proximal to each other. In the embodiment of FIG. 1, this proximity is due to the gate 120 conforming to the surface of the STI region 114 during fabrication as the gate 120 is formed adjacent to the STI region 114.

A p-type body region 128 is formed, adjacent to the n-type drift layers 110 and 112, where for some embodiments the gate 120 may provide self-alignment of the p-type body region 128. For some embodiments, the p-type body region 128 may be formed before forming the gate 120. The p-type body region 128 may be described as being adjacent to the n-type drift layers 110 and 112, so that the STI region 114 is disposed between the drain region 116 and the p-type body region 128. A non-heavily doped n-type region 130 may be formed in the p-type body region 128, followed by depositing a spacer layer 132 adjacent to the gate 120, followed by forming a heavily doped n-type region 134 so that the regions 130 and 134 provide a source region. A body contact 136 is a heavily doped p-type region in the p-type body region 128 to provide an ohmic contact to the p-type body region 128.

In some embodiments, to form part of the source region (the region 130), an upper region of the p-type body 128 may be implanted with arsenic with a dose of $3 \cdot 10^{13}$ cm$^{-2}$ to $1 \cdot 10^{15}$ cm$^{-2}$ at an energy of 25 KeV to 160 KeV, with implant angles from 0° to 9°. In some embodiments, the upper region of the p-type body 128 may also be implanted with boron with a dose of $1 \cdot 10^{13}$ cm$^{-2}$ to $5 \cdot 10^{14}$ cm$^{-2}$ at an energy of 60 KeV to 260 KeV, with implant angles from 7° to 35°, for the body contact 136. In some embodiments, a bottom region of the p-type body 128 may be implanted with boron with a dose of $2 \cdot 10^{12}$ cm$^{-2}$ to $6 \cdot 10^{13}$ cm$^{-2}$ at an energy of 300 KeV to 1.6 MeV, with implant angles from 0° to 9° to connect the p-type body 128 to the p-type buried layer 108 for RESURF.

A contact 138 is formed on the source region (region 134) and the body contact 136. Vias and other metal layers (not shown) are electrically connected to the contact 138 to provide electrical connection to the p-type body 128 and to the source region (regions 130 and 134).

Portions of the p-type body 128 and the n-type drift layer 112 that are near each other and share an interface define a JFET region. In some embodiments, before the gate oxide region 119 and the gate 120 are formed, a region 139 in the JFET region, specifically in the n-type drift layer 112 adjacent to the STI region 114, is doped with implants to fine-tune the electric field in the JFET region. The region 139 shares a rounded interface with the rounded corner 126 of the STI region 114. The region 139 is referred to as a JFET adjusting implant region 139.

Some embodiments may have one p-type buried layer instead of the two p-type buried layers 106 and 108, and one n-type drift layer instead of the two n-type drift layers 110 and 112. However with the layers 106, 108, 110, and 112 having a balanced doping profile, the illustrative LDMOS 100 may be better (or fully) depleted under reverse bias so that higher voltage circuits may be realized, with a relatively small drift layer.

The illustrative LDMOS 100 is an n-channel LDMOS, where the majority carriers of the n-type regions are electrons and the majority carriers of the p-type regions are holes. Other embodiments may interchange the n-type regions and p-type regions so that a p-channel LDMOS may be fabricated.

An STI region 140 may be formed when the STI region 114 is formed, where the STI region 140 helps provide isolation from other devices (not shown). A deep trench comprising vertical layers of n-type, p-type, and oxide layers may be formed next to the illustrative LDMOS 100 to provide further isolation, but for ease of illustration these layers are not shown.

Figure 2:
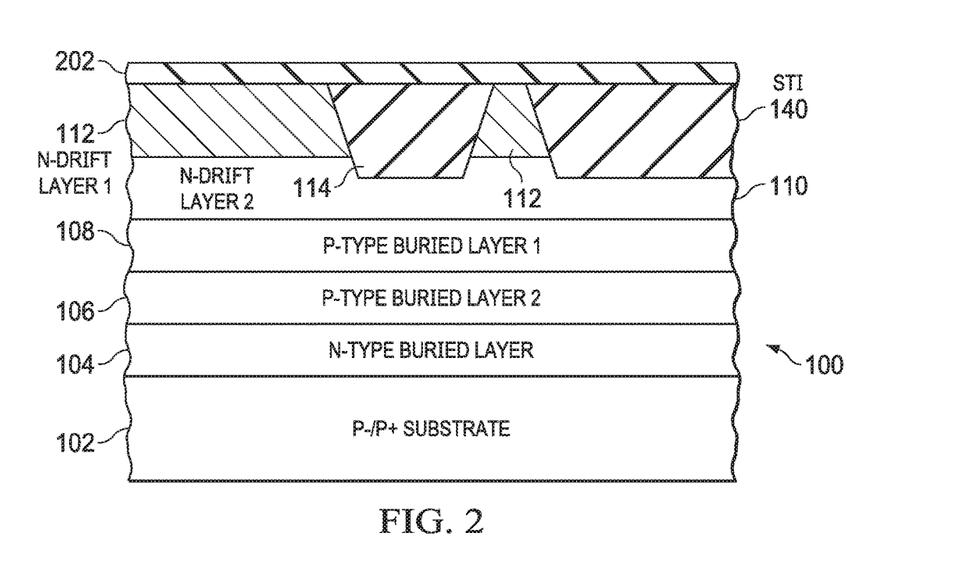
FIG. 2 shows fabrication of an illustrative LDMOS in accordance with various examples.

FIG. 2 illustrates fabrication of the illustrative LDMOS 100 according to an embodiment, where the STI regions 114 and 140 are formed after forming the layers 104, 106, 108, 110, and 112. The STI regions 114 and 140 may be formed with the same process steps, where their respective trenches are etched and lined with an oxide liner (not shown), an oxide (SiO$_2$) is deposited over the oxide liner, and CMP (chemical mechanical polishing) is performed. (FIG. 1 shows the STI region 140 somewhat thicker than as shown in FIG. 2 because of additional oxide growth at later process steps.) A sacrificial pad oxide layer 202 is grown over the STI regions 114 and 140 and the n-type drift layer 112.

Figure 3:
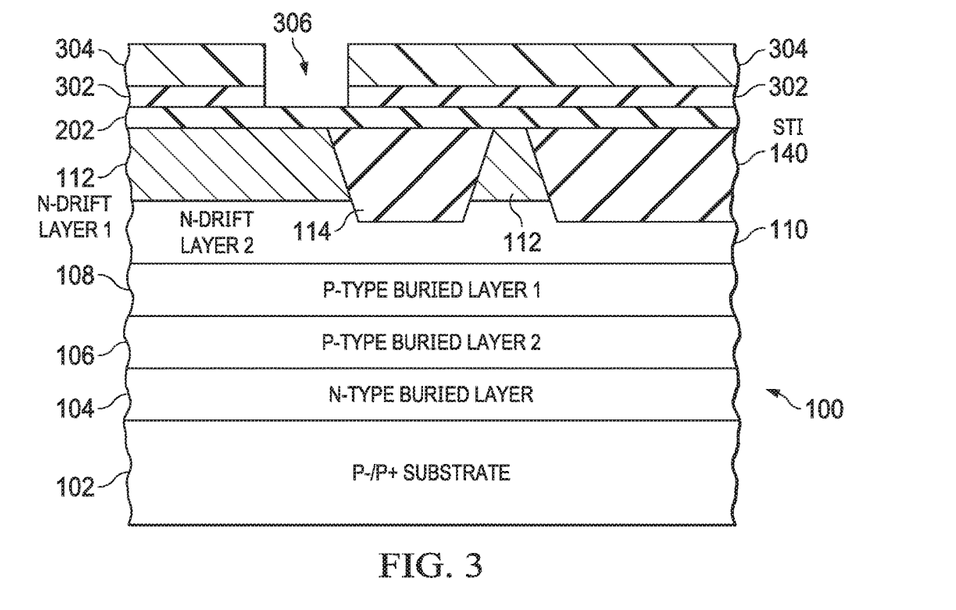
FIG. 3 shows fabrication of an illustrative LDMOS in accordance with various examples.

FIG. 3 illustrates fabrication of the illustrative LDMOS 100 according to an embodiment, where a nitride (Si$_3$N$_4$) layer 302 and a photoresist layer 304 are formed over the sacrificial pad oxide layer 202. An opening pattern 306 is exposed in the photoresist layer 304 and etched to expose an opening to the nitride layer 302, followed by etching the opening to the nitride layer 302 to expose an opening to the sacrificial pad oxide layer 202.

Figure 4:
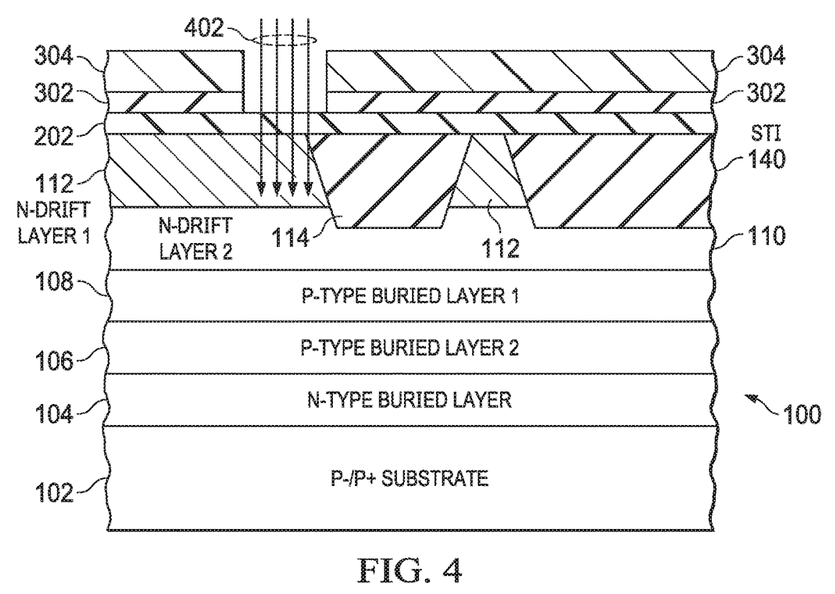
FIG. 4 shows fabrication of an illustrative LDMOS in accordance with various examples.

FIG. 4 illustrates fabrication of the illustrative LDMOS 100 according to an embodiment, where arrows 402 indicate the step of implanting dopants into that part of the n-type drift layer 112 that will be part of the JFET region and that will form the JFET adjusting implant region 139. The dopants are implanted through the opening to the sacrificial pad oxide layer 202. In the embodiment of FIG. 4, the dopants are n-type donors.

Figure 5:
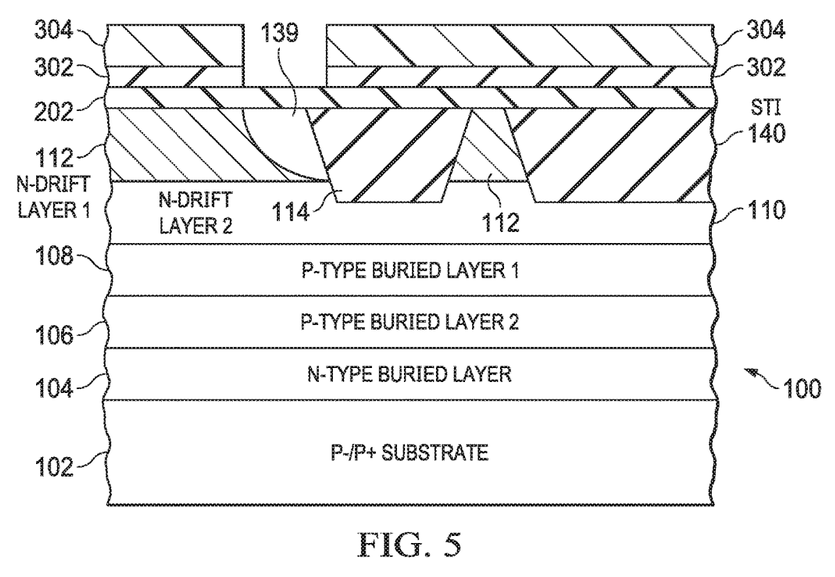
FIG. 5 shows fabrication of an illustrative LDMOS in accordance with various examples.

FIG. 5 illustrates fabrication of the illustrative LDMOS 100 according to an embodiment, illustrating the JFET adjusting implant region 139 resulting from the doping step of FIG. 4. For some embodiments, to form the JFET adjusting implant region 139, phosphorous or arsenic may be implanted at a dose of $6 \cdot 10^{11}$ cm$^{-2}$ to $9 \cdot 10^{12}$ cm$^{-2}$ with energy in the range of 25 KeV to 250 KeV, and with implant angles from 0° to 9° to compensate for interface states and to reduce the JFET region resistance.

Doping the JFET region of the illustrative LDMOS 100 to provide the JFET adjusting implant region 139 can reduce the JFET region resistance and allow for adjustment of the electric field in the JFET region. Chain implantation to provide the doping profiles of the JFET region, the n-type drift layers 110 and 112, and the p-type buried layers 106 and 108 allows for trading off performance with the gate length (i.e., the gate length associated with the gate 120), hot carriers, and drift layer resistance. The doping profile can help shield the electric field between the p-type body region 128 to a sidewall of the STI region 114 (e.g., the rounded corner 126 in FIG. 1) and the p-type buried layer 108 to that part of the n-type drift layer 110 below the bottom of the STI region 114. This can help mitigate surface punch-through of the resulting small channel, so that the illustrative LDMOS 100 may realize a relatively small gate length with low leakage and a reduced gate-to-source capacitance.

Figure 6:
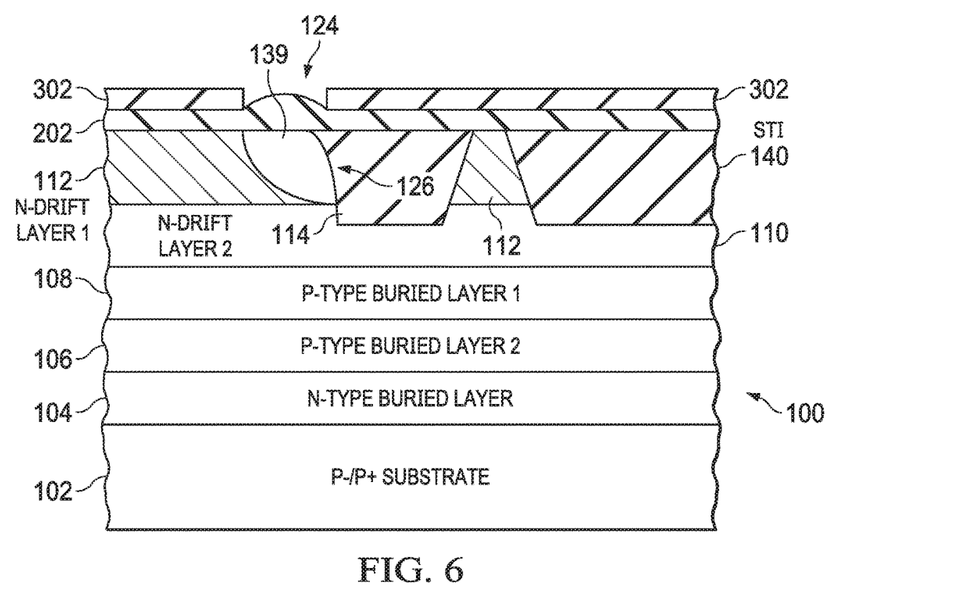
FIG. 6 shows fabrication of an illustrative LDMOS in accordance with various examples.

FIG. 6 illustrates fabrication of the illustrative LDMOS 100 according to an embodiment. The photoresist layer 304 is removed, followed by thermal oxide growth on the opening to the sacrificial pad oxide layer 202, resulting in the lift-up region 124. In some embodiments, the additional oxide grown on the opening to the sacrificial pad oxide layer 202 may have a thickness greater than 200 angstroms, for example from 360 angstroms to 1600 angstroms, and grown at a temperature between 760° C. to 990° C. The sacrificial pad oxide layer 202 when first formed is about 100 angstroms thick, so that the additional oxide due to thermal growth is substantially larger than the initial thickness of the sacrificial pad oxide layer 202. The figures are not drawn to scale, and therefore do not depict the scale of the oxide growth relative to the sacrificial pad oxide layer 202. There is also growth of the STI region 114 into the n-type drift layer 112, resulting in the rounded corner 126.

Figure 7:
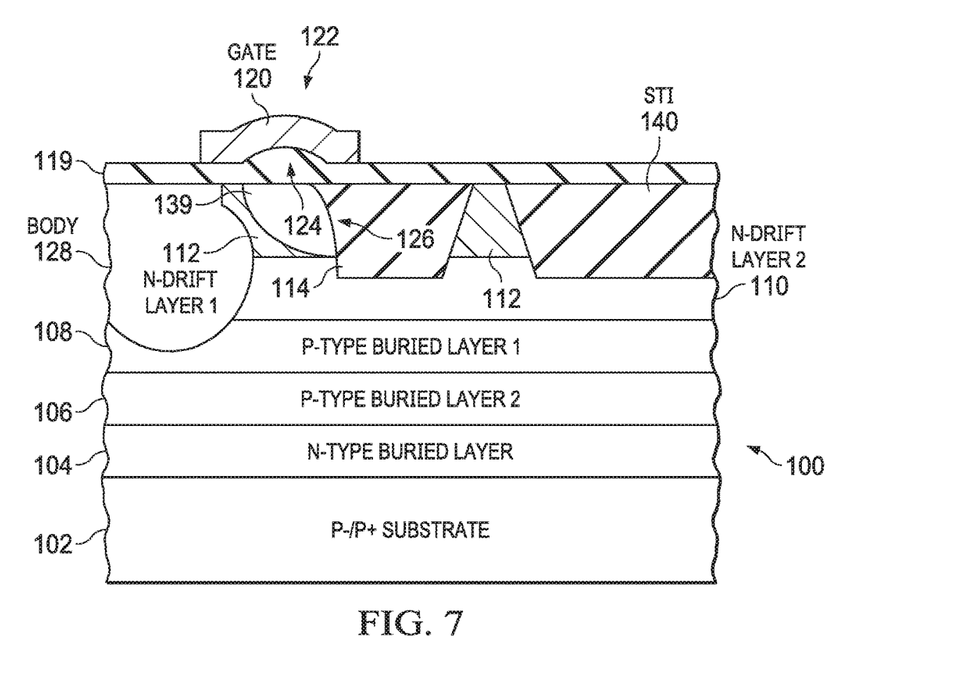
FIG. 7 shows fabrication of an illustrative LDMOS in accordance with various examples.

FIG. 7 illustrates fabrication of the illustrative LDMOS 100 according to an embodiment. After the thermal growth of oxide depicted in FIG. 6, the nitride layer 302 is stripped off, a photoresist layer (not shown) is deposited, patterned, and etched for the body region, and dopants are implanted to form the body region 128. The photoresist layer is removed, and the sacrificial pad oxide layer 202 is removed. Because the oxide thickness due to thermal growth is much larger than the initial thickness of the sacrificial pad oxide layer 202, removal of the sacrificial pad oxide layer 202 still leaves a relatively substantial thickness of oxide in the lift-up region 124. A high quality gate oxide is thermally grown after removing the sacrificial pad oxide layer 202, resulting in the oxide layer 119 depicted in FIG. 7.

The gate 120 is formed on the oxide layer 119 over portions of the body region 128, part of the n-type drift layer 112 and the JFET adjusting implant region 139, and the STI region 114, as shown in FIG. 7. The gate 120 may be formed by depositing polysilicon on the oxide layer 119, depositing a photoresist layer on the polysilicon, patterning and etching away exposed parts of the photoresist layer to expose unwanted portions of the polysilicon, followed by removing the unwanted polysilicon. A silicide may be formed on the polysilicon to reduce its sheet resistance. As the polysilicon is deposited to form the gate 120, the gate 120 forms the lift-up region 122 due to the lift-up region 124 in the oxide layer 119. Additional process steps are performed to fabricate the source region (regions 130 and 134), the body contact 136, and the drain region 116.

Figure 8:
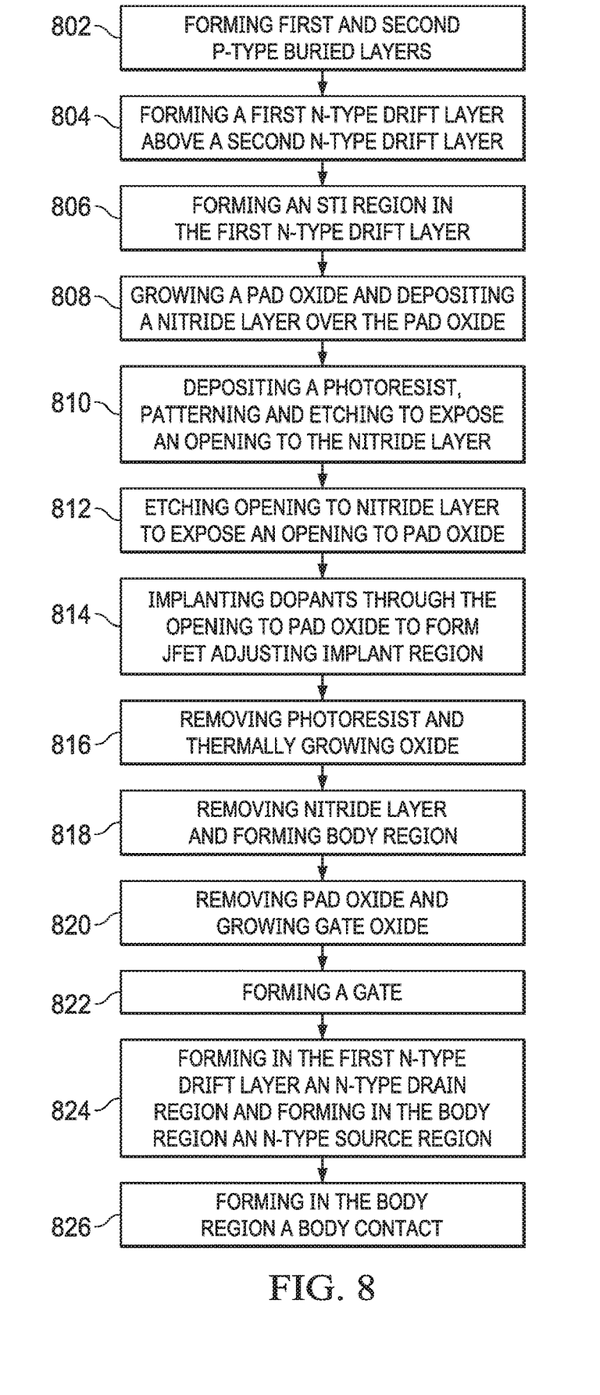
FIG. 8 shows illustrative process steps to fabricate an illustrative LDMOS in accordance with embodiments.

FIG. 8 depicts an illustrative process to fabricate the illustrative LDMOS 100 in accordance with embodiments. In step 802, first and second p-type buried layers are formed in a semiconductor substrate. In step 804, a first n-type drift layer is formed above a second n-type second drift layer. In step 806 an STI region is formed in the first n-type drift layer. In step 808 a sacrificial pad oxide layer is grown, and a nitride layer is deposited over the sacrificial pad oxide layer.

In step 810 a photoresist layer is deposited, lithographically exposed, baked, and etched to expose an opening to the nitride layer. In step 812 the opening to the nitride layer is etched to expose an opening to the sacrificial pad oxide layer. In step 814 a region in the first n-type drift layer is doped by implanting donors through the opening to the sacrificial pad oxide layer. This region will be part of the JFET region when the p-type body region 128 is formed, and has been referred to previously as the JFET adjusting implant region.

After the photoresist layer is removed, in step 816 the opening to the sacrificial pad oxide layer is thermally grown. In step 818 the nitride layer is removed and a body region is formed. In step 820 the sacrificial pad oxide layer is removed (leaving most of the oxide growth of step 816), and a high quality gate oxide is grown. In step 822 a gate is deposited over the oxide, and patterned and etched using a photoresist layer to form a gate. In the remaining steps, the other basic components of the illustrative LDMOS 100 are formed. For example, in step 824 an n-type drain region is formed in the first n-type drift layer, and an n-type source region is formed in the p-type body region. In step 826 a body contact is formed in the p-type body region.

FIG. 8 summarizes some of the basic steps to fabricate the illustrative LDMOS 100, but some of the steps are optional for some embodiments. For example, some embodiments may not have the JFET adjusting implant region 139, and some embodiments may have one p-type buried layer or one n-type drift layer. Furthermore, the ordering of the steps illustrated in FIG. 8 does not necessarily imply a particular ordering of steps in a fabrication process.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A method comprising:
   forming in a semiconductor a first drift layer having majority carriers of a first type;
   forming a shallow trench isolation region in the first drift layer;
   growing a pad oxide layer over the semiconductor;
   depositing a nitride layer over the pad oxide layer;
   depositing a photoresist layer over the nitride layer;
   exposing an opening pattern in the photoresist layer;
   etching an opening in the photoresist layer based on the opening pattern to expose an opening to the nitride layer;
   etching the opening to the nitride layer to expose an opening to the pad oxide layer;
   removing the photoresist layer;
   growing oxide on the opening to the pad oxide layer;
   removing the nitride layer;
   removing the pad oxide layer, leaving at least part of the oxide grown on the pad oxide layer;
   growing a gate oxide layer;
   forming a gate over the gate oxide layer;
   forming in the first drift layer a drain region having majority carriers of the first type;
   forming in the semiconductor a body region having majority carriers of a second type; and
   forming in the body region a source region having majority carriers of the first type.

2. The method of claim 1, wherein growing the oxide on the opening to the pad oxide layer includes growing the oxide to a thickness of at least 200 angstroms.

3. The method of claim 1, the method further comprising:
   implanting dopants through the opening to the pad oxide layer to provide majority carriers of the first type.

4. The method of claim 1, wherein the semiconductor comprises silicon and the oxide, pad oxide layer, and gate oxide layer each comprises silicon dioxide, wherein growing the oxide on the opening to the oxide pad layer comprises oxidizing the semiconductor.

5. The method of claim 1, further comprising:
   forming in the semiconductor a second drift layer having majority carriers of the first type.

6. The method of claim 5, further comprising:
   forming in the semiconductor a first buried layer having majority carriers of the second type.

7. The method of claim 6, further comprising:
   forming in the semiconductor a second buried layer having majority carriers of the second type.

8. A method comprising:
   forming a doped layer at a surface of a semiconductor substrate;
   filling a trench within the doped layer with a trench oxide, the trench having a corner at which a trench sidewall meets a surface of the doped layer;

forming an oxide layer over the semiconductor substrate, including along the surface of the doped layer, the oxide layer having a first thickness;

forming a gate structure on the oxide layer over the doped layer and the trench, including over the trench corner; and forming between the gate structure and the trench corner a raised portion of the oxide layer that has a second thickness greater than the first thickness, including thermally oxidizing a portion of the doped layer exposed by a window in a mask formed over the substrate.

9. The method of claim 8, wherein the first thickness is about 10 nm, and the second thickness is greater than about 20 nm.

10. The method of claim 8, wherein the second thickness is at least about 20 nm.

11. The method of claim 8, further comprising implanting an additional dopant into the doped layer through the window.

12. A method, comprising:

forming a doped layer at a surface of a semiconductor substrate;

filling a trench within the doped layer with a trench oxide, the trench having a corner at which a trench sidewall meets a surface of the doped layer;

forming an oxide layer over the semiconductor substrate, including along the surface of the doped layer, the oxide layer having a first thickness;

forming a gate structure on the oxide layer over the doped layer and the trench, including over the trench corner;

forming between the gate structure and the trench corner a raised portion of the oxide layer that has a second thickness greater than the first thickness; and forming a doped region within the doped layer and underlying the trench corner.

13. The method of claim 12, further comprising forming a source region and a drain region having a first conductivity type at the surface of the substrate, the doped region being located between the source region and the drain region.

14. A method comprising:

forming a dielectric-filled trench at a surface of a semiconductor substrate;

forming a doped region of the semiconductor substrate adjacent the dielectric-filled trench, wherein the doped region and the dielectric-filled trench share an interface that has a terminus at the surface of the semiconductor substrate;

forming an oxide layer having a thickness over the semiconductor substrate, including along the surface of the doped region, the oxide layer having a first thickness; and selectively increasing the thickness of the oxide layer over the terminus to a second greater thickness, including thermally oxidizing a portion of the doped region exposed by a window in a mask formed over the substrate.

15. The method of claim 14, wherein the first thickness is about 10 nm, and the second thickness is greater than about 20 nm.

16. The method of claim 14, further comprising forming a gate over the doped region and the terminus.

17. The method of claim 14, wherein the doped region is a portion of a laterally diffused MOSFET (LD-MOSFET), and the doped region is a drift region of the LD-MOSFET.

18. The method of claim 14, wherein the doped region is a first doped region having a conductivity of a first type, and further comprising forming a second doped region having the first conductivity type connected to the first doped region and underlying the trench.

* * * * *